US005345185A

United States Patent [19]
Gilbert

[11] Patent Number: 5,345,185
[45] Date of Patent: Sep. 6, 1994

[54] LOGARITHMIC AMPLIFIER GAIN STAGE

[75] Inventor: Barrie Gilbert, Portland, Oreg.

[73] Assignee: Analog Devices, Inc., Norwood, Mass.

[21] Appl. No.: 868,490

[22] Filed: Apr. 14, 1992

[51] Int. Cl.[5] ............................................. G06G 7/24
[52] U.S. Cl. ..................................... 328/145; 307/492
[58] Field of Search ..................... 307/492; 328/145; 330/254, 252

[56] References Cited

U.S. PATENT DOCUMENTS

| | | | |
|---|---|---|---|
| 3,435,353 | 3/1969 | Sauber | 328/145 |
| 3,584,232 | 6/1971 | Wallace, Jr. | 307/229 |
| 3,605,027 | 9/1971 | Nichols | 328/145 |
| 3,668,535 | 6/1972 | Lansdowne | 329/192 |
| 4,238,738 | 12/1980 | Komori | 330/256 |
| 4,242,693 | 12/1980 | Biran | 357/28 |
| 4,274,061 | 6/1981 | Kraemer | 330/296 |
| 4,323,854 | 4/1982 | Hester | 330/256 |
| 4,333,023 | 6/1982 | Hood, Jr. | 307/310 |
| 4,565,935 | 1/1986 | Rolfe | 307/491 |
| 4,604,532 | 8/1986 | Gilbert | 307/490 |
| 4,604,586 | 8/1986 | Rinderle | 330/288 |
| 4,701,720 | 10/1987 | Monticelli | 330/260 |
| 4,716,316 | 12/1987 | Colin | 307/492 |
| 4,724,337 | 2/1988 | Maeda et al. | 307/262 |
| 4,724,397 | 2/1988 | Davis | 330/256 |
| 4,929,909 | 5/1990 | Gilbert | 330/256 |
| 4,933,641 | 6/1990 | Hsiung et al. | 328/145 |
| 4,990,803 | 2/1991 | Gilbert | 307/492 |
| 5,057,717 | 10/1991 | Kimura | 328/145 |

FOREIGN PATENT DOCUMENTS

| | | | |
|---|---|---|---|
| 064126 | 11/1982 | European Pat. Off. | 330/261 |
| 0248428 | 12/1987 | European Pat. Off. | |
| 1208771 | 1/1966 | Fed. Rep. of Germany. | |
| 2545535 | 4/1977 | Fed. Rep. of Germany. | |
| 58-036008 | 5/1983 | Japan. | |
| 0296610 | 12/1987 | Japan | 307/492 |
| 01010707 | 4/1989 | Japan. | |
| 2067374A | 7/1981 | United Kingdom | 330/261 |

Primary Examiner—Timothy P. Callahan
Assistant Examiner—Toan Tran
Attorney, Agent, or Firm—Wolf, Greenfield & Sacks

[57] ABSTRACT

A logarithmic amplifier gain stage for supplying, in response to an instantaneous input signal, an output signal representing a portion of a corresponding logarithmic value of the input signal. The gain stage includes a transistor amplifier having an input that receives the input signal and an intermediate output that supplies an intermediate output signal. A full-wave detector having an input coupled to the intermediate output of the transistor amplifier receives the intermediate output signal and supplies the output signal wherein the detector includes a rectifier comprising transistors having different effective emitter areas. The different emitter areas can be formed by physical differences in emitter area of the full-wave rectifier transistors. In another embodiment of the invention, the different emitter areas can be synthesized by controlling a voltage between a base and an emitter of at least one transistor in the full-wave rectifier. The full-wave detector performs the demodulating function and also drives the input of a succeeding gain stage.

22 Claims, 6 Drawing Sheets

LOGARITHMIC AMPLIFIER GAIN STAGE

BACKGROUND OF THE INVENTION

1. Field of the Invention

The present invention relates generally to the field of logarithmic amplifiers. More particularly, the present invention relates to a high performance, low power logarithmic amplifier cell for use in a multi-stage logarithmic amplifier providing accurate logarithmic intercept and slope response.

2. Discussion of the Related Art

Until recently, logarithmic amplifiers were practically unavailable which are useful for both low frequency and high frequency applications, and which are inherently free of sensitivity to temperature variations and production tolerances of the devices comprising the active elements so as to provide high accuracy log-law performance over a wide temperature range and in the presence of large production variations.

U.S. Pat. Nos. 4,929,909 and 4,990,803 (hereafter "the '909 patent" and "the '803 patent", respectively), assigned to the same assignee as the present invention and incorporated herein by reference, describe a logarithmic amplifier which does not suffer from the above-noted limitations.

FIG. 1 is a block diagram of the logarithmic amplifier disclosed in the '803 patent. The amplifier includes a plurality of amplifier/limiter/detector stages (hereinafter referred to as "gain" stages or "logarithmic amplifier gain stages") 100-1 through 100-n, a gain bias generator 102, a scale bias generator 104, and an offset generator 106, which are common to all gain stages. All of the gain stages working together produce a logarithmic output signal corresponding to the input signal. FIG. 2 is a block diagram for each of the gain stages 100-1 through 100-n. Each gain stage 100-i includes an emitter follower 112-i, having a differential input and balanced output, a full-wave detector 114-i, and a limiting amplifier 116-i. The emitter follower 112-i introduces a slight gain loss of approximately 0.07 dB. The limiting amplifier 116-i can be designed to provide a gain of 10.07 dB, so that the overall stage gain is 10 dB.

Although the logarithmic amplifier of the '909 and '803 patents performs well, that demodulating logarithmic amplifier requires relatively complicated gain stages having a relatively large number of active components, both positive and negative power supplies and requires approximately 300 milliwatts of power for a ten stage amplifier.

SUMMARY OF THE INVENTION

The present invention provides a logarithmic amplifier gain stage for supplying, in response to an instantaneous input signal, an output signal representing a portion of a corresponding logarithmic value of the input signal. Alternatively, in response to an alternating input signal, the gain stage produces a demodulated output signal representing a portion of a corresponding logarithmic value of the input signal. The logarithmic amplifier gain stage includes a transistor amplifier having an input that receives the input signal and an intermediate output that supplies an intermediate output signal; and a full-wave detector having an input coupled to the intermediate output of the transistor amplifier that receives the intermediate output signal, and an output that supplies the output signal. The full-wave detector includes a rectifier comprising transistors having different effective emitter areas. The different emitter areas can be formed by physical differences in emitter areas of the rectifier transistors. In another embodiment of the invention, the effect of different emitter areas can be synthesized by using a bias voltage between a base and an emitter of at least one transistor in the rectifier. Other embodiments of the invention include means for extending the usable frequency range by increasing a slew rate of the gain stage without consuming additional power. The logarithmic amplifier gain stage further includes means for reducing a variation in a phase of the output signal with a variation in a level of the input signal.

The logarithmic amplifier gain stage of the present invention is less complex and consumes less power than the prior art, and requires power from only a single polarity power supply. In the present invention, the gain stage has been simplified and the full-wave detector performs the demodulating function and also drives the input of the succeeding gain stage with DC level-shifting. The logarithmic amplifier gain stage of the present invention is particularly well suited to use in a multiple stage, logarithmic amplifier system. The response of each stage can be tailored so that the overall logarithmic amplifier has a desired response.

The features and advantages of the present invention will be more readily understood and apparent from the following detailed description of the invention, which should be read in conjunction with the accompanying drawings, and from the claims which are appended at the end of the detailed description.

BRIEF DESCRIPTION OF THE DRAWINGS

In the drawings, which are incorporated herein by reference and in which like elements have been given like reference characters.

DETAILED DESCRIPTION

Figure 2:
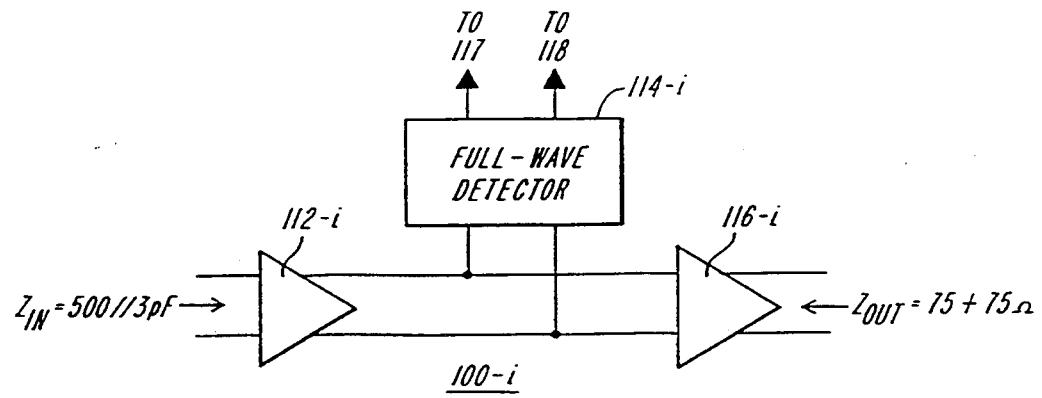
FIG. 2 is a simplified block diagram of each of the gain stages 100-i illustrated in FIG. 1.

FIG. 2 illustrates the configuration of each of the gain stages 100-i in the logarithmic amplifier of the '803 patent. There is a separate emitter follower circuit 112-i, a full-wave detector circuit 114-i, and a limiting amplifier 116-i in each stage.

Figure 1:
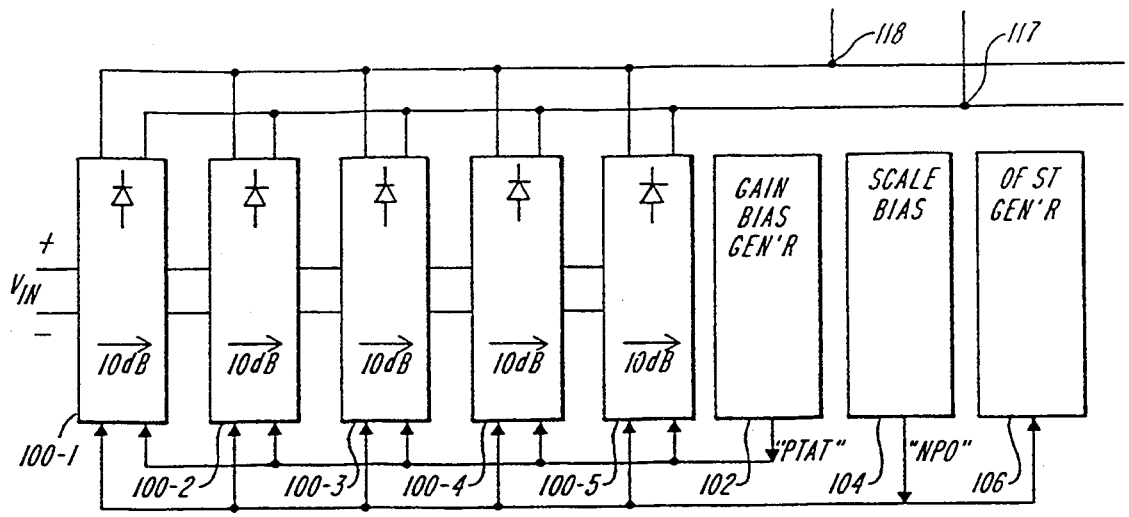
FIG. 1 is a block diagram of a prior art logarithmic amplifier illustrated in the '909 and '803 patents.
Figure 3:
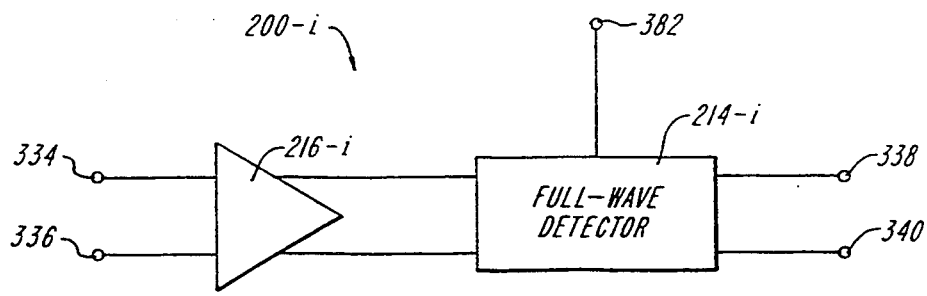
FIG. 3 is a simplified block diagram of a logarithmic amplifier gain stage of the present invention which can be used in the basic logarithmic amplifier design illustrated in FIG. 1.

Reference is now made to FIG. 3 which shows a simplified block diagram of the logarithmic amplifier gain stage of the present invention. Each of the gain stages 200-i of FIG. 3 replaces gain stages 100-i illustrated in FIG. 2 in an amplifier of the type shown in FIG. 1. The gain stages 200-i each include a limiting amplifier 216-i and a full-wave detector 214-i. The separate emitter follower circuit in FIG. 2 is not used; its function is incorporated into full-wave detector circuit 214-i. Thus, in the present invention, the gain stages have been simplified and the transistors in the full-wave detector perform both the demodulating function and provide power-gain and DC-level translation to the input of the succeeding gain stage.

Figure 4:
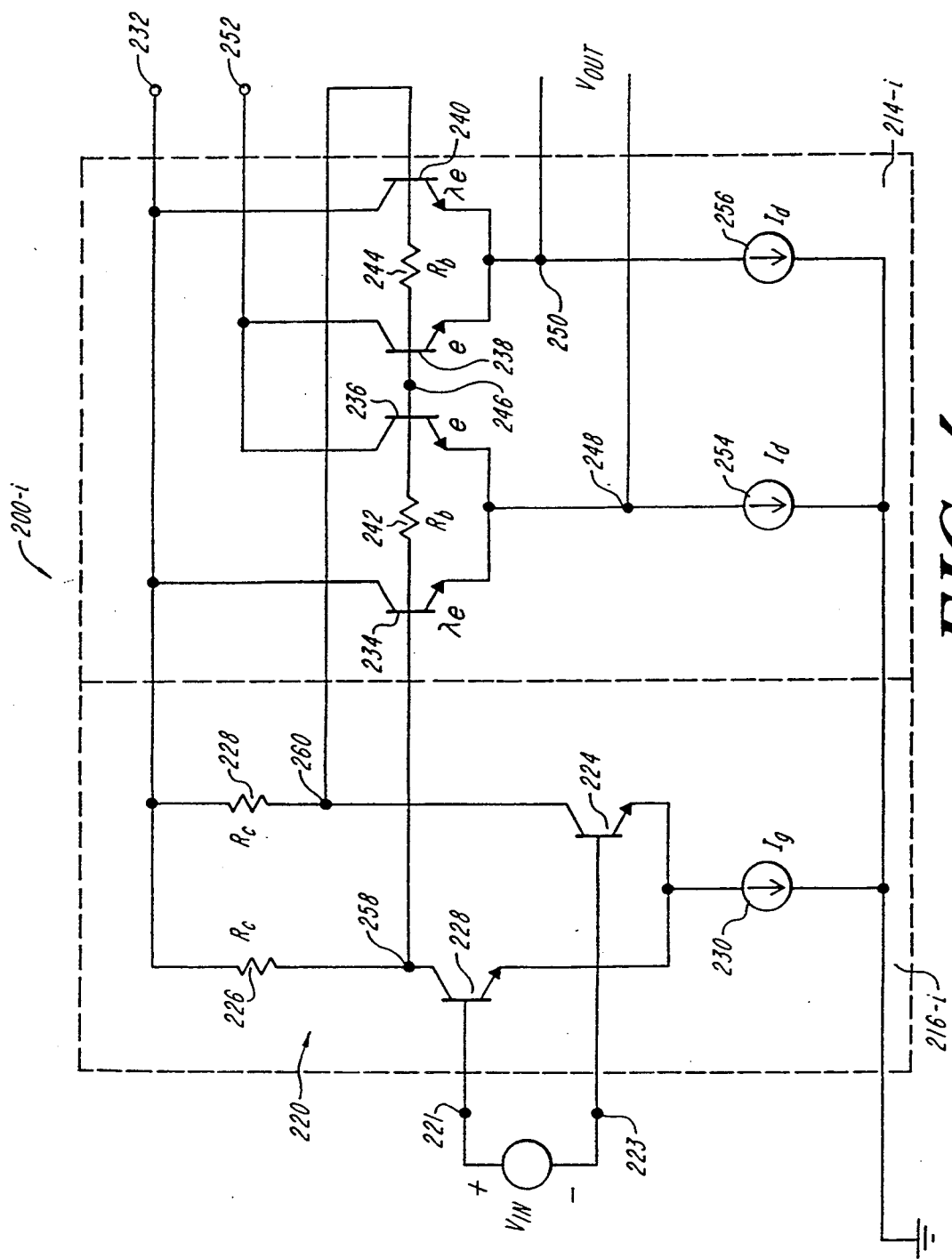
FIG. 4 is a simplified schematic circuit diagram of the full-wave detector and limiting amplifier illustrated in FIG. 3.

Reference is now made to FIG. 4, which is a simplified circuit schematic of the gain stage 200-i illustrated in FIG. 3. Although the present invention is illustrated as being implemented using bipolar NPN transistors, PNP transistors can be used where the gain stage is powered by a negative single polarity power supply. Gain stage 200-i is powered by a single polarity power supply which may be, for example, a +5 volt supply. Plus 5 volts is applied to terminal 232. Limiting amplifier 216-i includes a long tail pair 220 comprising transistors 222 and 224 and resistors 226 and 228. An input signal $V_{in}$ is applied across nodes 221 and 223. Resistors 226 and 228 are equal valued resistors. A tail current generator 230 generates a tail current $I_g$ which is essentially proportional to absolute temperature (PTAT). Tail current generator 230 may operate in the manner described in the '909 and '803 patents for limiting amplifier 116-i.

The full-wave detector 214-i is composed of transistors 234, 236, 238, and 240. Resistors 242 and 244 bias base node 246 between transistors 236 and 238. Transistors 234 and 240 function as emitter followers supplying current to drive a succeeding amplifier stage connected to nodes 248 and 250, as well as functioning as part of the full-wave detector. Transistors 234 and 236 form a first half-wave detector and transistors 238 and 240 form a second half-wave detector so that the entire envelope of the input signal can be demodulated. The demodulated logarithmic output appears as a current at node 252.

An additional benefit to the topology of the present invention is the elimination of the cascode transistors 162 and 164 used in detector 114-i in the '803 patent. As will be explained in greater detail, the voltage at node 246 is independent of the signal. Consequently, there is no displacement current due to base-collector capacitances of transistors 236 and 238 that could disturb the output node 252. As a result, cascode transistors 162 and 164 are not needed.

Detector current generators 254 and 256 generate a temperature-stable detector bias current, $I_d$ in the manner described in the '803 patent.

In the gain stage of the '803 patent, the bias currents of the emitter follower circuit 112-i were made PTAT. By contrast, in the present invention, the bias current $I_d$ of emitter followers 234 and 240, since they are now incorporated into the full-wave detector and function as part of the detector circuit as well as emitter followers, correspond to the stable detector-scaling currents of the '803 patent.

Since the common base node 246 is biased by resistors 242 and 244, the effective value of load resistors, $R_a$, which determines the gain A is equal to the parallel combination of the value of the collector resistor 226 or 228 in each leg of the long tail pair and the value of the base resistors 242 or 244. Thus, the effective load resistance, $R_a$, of the gain stage may be found from the following equation:

$$R_a = \frac{(R_c)(R_b)}{R_c + R_b} \quad (1)$$

where:

$R_c$ = the resistance of either resistor 226 or 228

$R_b$ = the resistance of either resistor 242 or 244

This topology is useful because the values of $R_c$ and $R_b$ can be chosen over a wide range as long as the resulting effective value $R_a$ provides the desired gain. It does not matter if resistances $R_b$ are made low and resistances $R_c$ are made high or vice versa.

The presence of high resistances in the base circuit has no essential impact on the slew rate of the circuit, since the base charge required to change the current in either transistor 236 or 238 is provided by the opposite member of this pair, not by the current in the base resistors 242 and 244. That is, if transistor 238 is turning on, the base charge is provided from transistor 236, which at that time is turning off, due to the symmetry of the voltage drive at the respective emitters of transistors 236 and 238.

In the same manner, high values of resistors 226 and 228 allow the introduction of a DC voltage drop across the collector loads, which can be used to establish a preferred bias level at the amplifier output nodes 248 and 250, without adversely affecting the slew rate of the logarithmic amplifier gain stage.

An additional benefit of this flexibility in the partitioning of the net load $R_a$ between resistors $R_b$ and $R_c$ allows the collector and base resistors to be fabricated as integer multiples of some unit value, which value is used elsewhere in the biasing system for the overall logarithmic amplifier, to thereby insure very accurate calibration even when the unit value is considerably different from the target value. As long as all of the unit values are the same, compensation can be provided for variations of the unit value from the target value. That is, the relative values of the resistors are more important than the absolute values of the resistors.

Alternatively, the signal across nodes 258 and 260 can be connected directly to the next gain stage in the logarithmic amplifier. However, extra compensation circuitry is required to compensate for the sensitivity to the beta of transistors 222 and 224, since the succeeding gain stage would directly load the preceding gain stage.

A key feature of the full-wave detector 214-i of the present invention is that the effective emitter areas of transistors 236 and 238 are smaller than the effective emitter areas of transistors 234 and 240. This emitter area ratio between transistor pairs 234,236 and 238,240 is represented by λ, where λ is greater than 1. That is, if transistors 112 and 114 had an emitter area of "e," then transistors 110 and 116 would have emitter area ratios of (λ)(e). The term "effective emitter area" is used because, as will be described hereinafter, the difference in emitter area or area ratio can be achieved by physical variations in emitter area, or by electrical control of the detector transistors.

For zero-signal conditions, there is essentially no voltage difference between the bases of transistors 234 through 240. The portion of the detector bias currents $I_d$ is divided in proportion to the emitter areas of the respective detector transistors as follows:

$$I_{C234} = I_{C240} = \left(\frac{\lambda}{1+\lambda}\right) I_d \quad (2)$$

where:

$I_{C234}$=the collector current of transistor 234
$IC_{240}$=the collector current of transistor 240

$$I_{C236} = I_{C238} = \left(\frac{1}{1+\lambda}\right) I_d \quad (3)$$

where:

$I_{C236}$=the collector current of transistor 236
$I_{C238}$=the collector current of transistor 238

Transistors 238 and 240 respond to signals having one polarity, while transistors 234 and 236 respond to signals having an opposite polarity. Since detector 214-i is a full-wave detector, if the signal has one polarity, transistors 238 and 240 are conducting, while transistors 234 and 236 will be cutoff. Conversely, if the signal has the opposite polarity, transistors 234 and 236 are conducting, while transistors 238 and 240 are cutoff.

As illustrated by equations (2) and (3), the proportion of the detector bias current $I_d$ which reaches the output node 128 is a function of the emitter area ratios in each of the pairs of transistors (234,236 or 238,240) in the full-wave detector. There is an "optimum" value of X, meaning the value of $\lambda$ that results in the maximum change in the detector output, between zero signal and full-limiting for any given value of the bias current $I_d$. Optimizing the value of $\lambda$ results in the maximum detector "efficiency," which reduces power requirements since the largest output signal is produced for a given detector bias current. "Efficiency" in this context means the relationship between the quantity of output current for a given bias current. In addition, operating the detector circuit at the optimum value of $\lambda$ reduces the sensitivity of the detector to small errors in $\lambda$ that may occur during the circuit fabrication process.

One skilled in the art will appreciate that the detector efficiency is zero when $\lambda$ equals 1 because there is no even-order nonlinearity in the detector stage and therefore no rectification occurs at any signal level. At the other extreme, when $\lambda$ is very large, the detector efficiency again approaches zero because the voltage output from limiting amplifier 216-i at nodes 258 and 260 cannot overcome a built-in offset voltage, $V_{os}$, due to the area ratio, between the bases of transistors 234,236 and 238,240. This offset voltage can be expressed as follows:

$$V_{os} = \left(\frac{kT}{q}\right) \ln \lambda \quad (4)$$

where:

k=Boltzmann's constant
T=absolute temperature
q=the electronic charge

Consider the case where $\lambda$ equals 100. Using equation 4, the effective offset voltage at T=300° K. would be [25.85 millivolts] ·[ln(100)], or 119 millivolts. If the gain of amplifier 216-i is 10 dB, the peak output voltage across the collectors of transistors 222 and 224 is 163.5 millivolts (for ideal transistors at 300° K.); therefore, the peak differential drive to either transistor pair 234,236 or 238,240 (due to the splitting of the collector signal by resistors 242 and 244) is 81.75 millivolts. Since 81.75 millivolts is less than the offset voltage of 119 millivolts, there is very little rectified output voltage from the detector for such a high value of $\lambda$.

There is an "optimum" (as previously defined) value of the detector offset voltage, $V_{os}$, or equivalently, the emitter-area ratio, $\lambda$, for any given gain, A, of the gain stage. Table I illustrates examples of the optimum value of $\lambda$ for a given value of the gain A.

TABLE I

| $\lambda$ | A |
|---|---|
| 5 | 2 |
| 7 | 3 |
| 11 | 4 |

Operation at the optimum value of $\lambda$ results in two benefits: (1) small errors in the value of $\lambda$ which occurred due to production tolerances will not grossly alter the efficiency of the full-wave detector and (2) the detector output current variation between the zero-signal and fully-limiting conditions is the largest possible fraction of the detector bias current $I_d$. Consequently, the optimum value of $\lambda$ results in the largest detector output signal at node 252 with the smallest consumption of power.

In the logarithmic amplifier gain stage of the present invention, transistors 234 and 236 are used as part of full-wave detector 214-i but also function as emitter followers which supply the current to drive the next succeeding gain stage in a multi-stage logarithmic amplifier. This results in some signal attenuation to the succeeding gain stage. This attenuation must be known in order to accurately determine the overall stage gain between the input nodes 221,223 and the output nodes 248,250. Although the operation of transistors 234 and 236 will be explained, the explanation applies with equal force to the operation of transistors 238 and 240.

The voltage at node 246 is essentially fixed because the output from amplifier stage 216-i is fully differential. Consequently, for small signals, an incremental voltage $\Delta V_{c130}$ is conveyed to output node 248 by an attenuator composed of the dynamic emitter resistances of transistors 234 and 236, which produces a smaller output voltage, $\Delta V_{e234}$. Since the detector bias current splits among the detector transistors according to equations (2) and (3) the dynamic emitter resistances of transistors 234 and 236 are:

$$r_{e234} = \frac{V_t}{I_{C234}} = \left(\frac{1+\lambda}{\lambda I_d}\right) V_t \quad (5)$$

where:

$r_{e234}$=the dynamic emitter resistance of transistor 234
$V_t$=kT/q
$I_{C234}$=the collector current of transistor 234
$I_d$=the detector bias current $$r_{e236} = \frac{V_t}{I_{C236}} = \left(\frac{1+\lambda}{I_d}\right) V_t \quad (6)$$

where:

$r_{e236}$ = the dynamic emitter resistance of transistor 236

$V_t = kT/q$ $I_{C236}$ = the collector current of transistor 236

$I_d$ = the detector bias current

Consequently, the dynamic emitter resistances for small signals are in the ratio:

$$\frac{r_{e236}}{r_{e234}} = \lambda \tag{7}$$

The dynamic emitter resistances are independent of either $V_t$ or $I_d$. The dynamic emitter resistances are in the same ratio as the ratio of the emitter areas. As a result, the signal $\Delta V_{c130}$ is attenuated by a factor $\lambda/(1+\lambda)$. This loss is predictable and compensation can readily be provided by using a slightly higher gain in amplifier 216-i. This higher gain is denoted as $A'$ and is:

$$A' = \left(\frac{I_q \cdot R_a}{2(kT)/q}\right) \cdot \left(\frac{\lambda}{1+\lambda}\right) \tag{8}$$

An important performance advantage of the topology of the gain stage of the present invention arises from the fact that the voltage at node 246 is essentially independent of the signal because of the inherent symmetry of gain stage 216-i. The signal voltages at the input nodes 221 and 223 cause the collectors of transistors 222 and 224 to change by exactly equal increments, but with opposite polarity. Consequently, since the voltage at node 246 is essentially fixed, no displacement currents due to the input signal are generated by the collector-base capacitances of transistors 236 and 238. This absence of capacitive coupling to the logarithmic output is very important in high frequency logarithmic amplifiers, since these displacement currents can seriously degrade logarithmic accuracy at high frequencies. As referred to earlier, this is the reason why cascode transistors 162 and 164 can be eliminated.

Figure 4A:
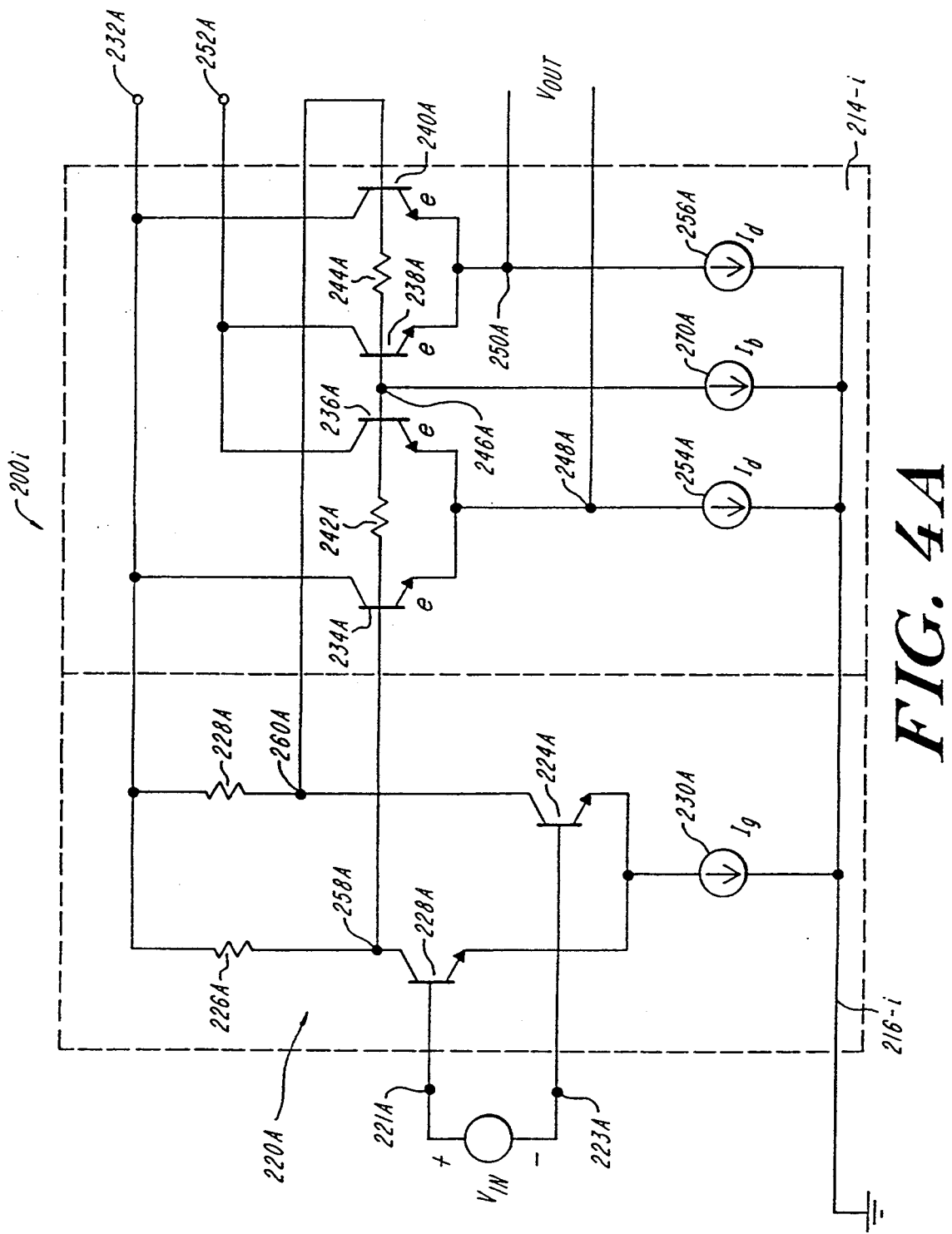
FIG. 4A illustrates another embodiment of the full-wave detector showing how different emitter areas can be generated electrically.

Reference is now made to FIG. 4A which illustrates an alternate embodiment of the logarithmic gain stage of the present invention. The operation of the gain stage illustrated in FIG. 4A is exactly the same as that described in connection with the embodiment illustrated in FIG. 4. However, in FIG. 4A, transistors 234A, 236A, 238A, and 240A are identical and have the same emitter areas. Thus, the physical ratio of emitter areas is 1. However, the effect of different emitter areas can be achieved by adding or subtracting a voltage to the $V_{BE}$ of a transistor. Thus, in FIG. 4A, an effective non-unity emitter area ratio between transistors 234A,236A and 238A,240A can be achieved by adding or subtracting a voltage to node 246A. Lowering the voltage at node 246A causes transistors 236A and 238A to behave as if their emitter areas are physically smaller than the emitter areas of transistors 234A and 240A, respectively. In the same manner, raising the voltage at node 246A causes the transistors 236A and 238A to behave as if their emitter areas they are physically larger than the emitter areas of transistors 234A and 240A. This is referred to as "synthesizing" the area ratio between the transistors.

As illustrated in FIG. 4A, the addition of another current source 270A that supplies a current $I_b$ acts to lower the voltage at node 246A so that the emitters of transistors 236A and 238A conduct a smaller current than they normally would for the given bias voltage at node 246A. Thus, the emitters of transistors 236A and 238A behave as if they are physically smaller than the respective emitters of transistors 234A and 240A. The current generated by current source 270A (i.e., $I_b$) must be PTAT so that the "synthesized area ratio" between transistors 234A,236A and 238A,240A is stable over temperature.

Synthesizing an area ratio by the use of a voltage allows the physical size of transistors 236A and 238A to be reduced, thereby lowering their respective base-collector capacitances. Reducing the base collector capacitances lowers the capacitive loading on amplifier stage 216-i, resulting in higher bandwidth. Furthermore, any area ratio can be synthesized by changing the values of resistors 242A and 244A and/or the current $I_b$. The values of resistors 242A and 244A and the magnitude of the current $I_b$ can be combined in any proportion to synthesize a desired area ratio. Additionally, physical area ratios and synthesized area ratios can be combined in any proportion to achieve a desired overall area ratio. This particular feature allows for flexibility in producing a monolithic integrated circuit because different die sizes and space considerations can be accommodated by choosing the respective proportions of physical and synthesized area ratio.

Figure 4B:
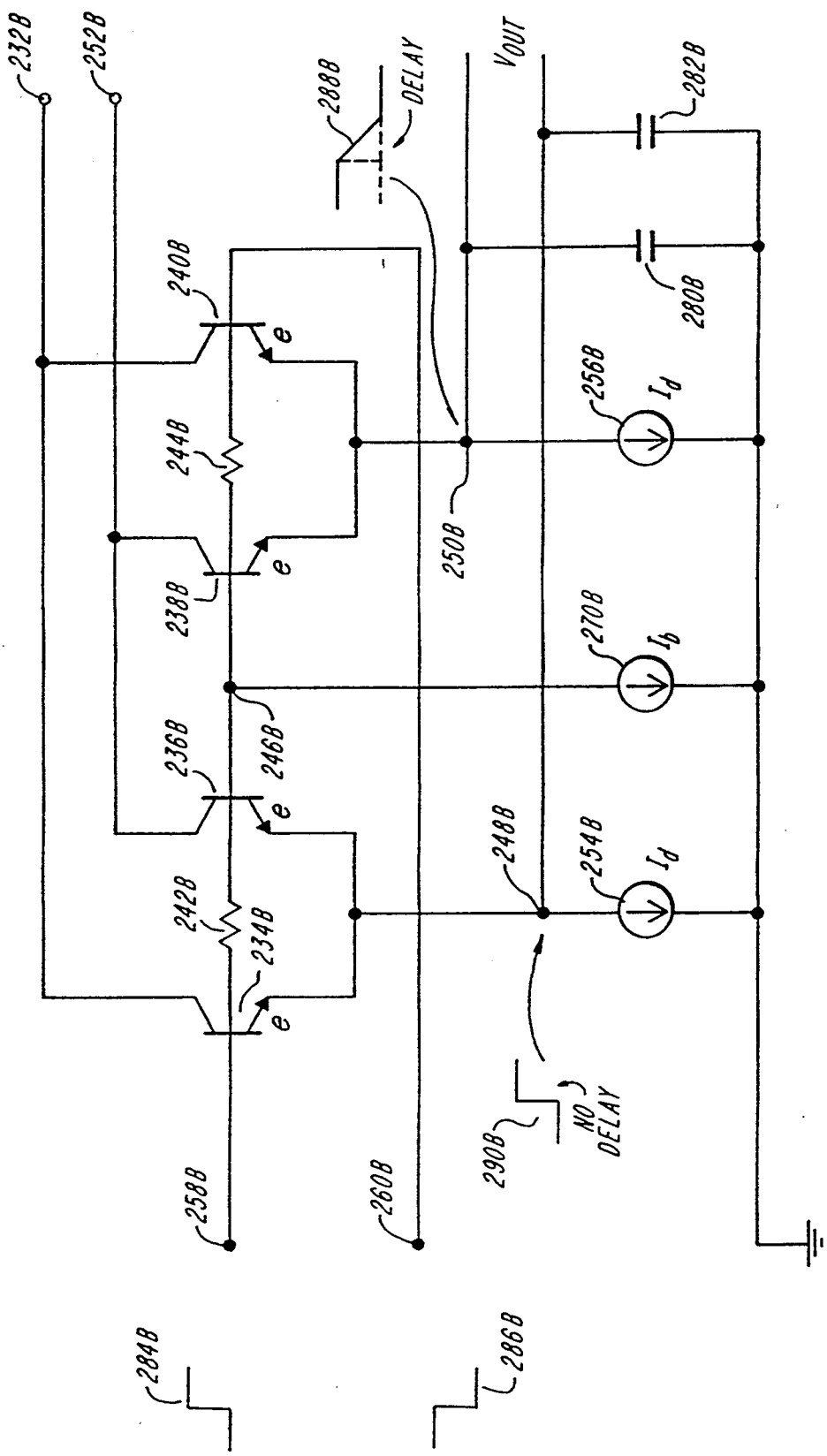
FIG. 4B illustrates slew rate limitations in the detectors of FIGS. 4 and 4A.

The present invention is designed to provide a logarithmic amplifier gain stage that consumes only a small fraction of the power of a comparable logarithmic gain stage, as described, for example, in the '803 patent. However, as the power consumed by the logarithmic gain stage is lowered, the available dynamic range begins to decrease partly due to the parasitic capacitances of the transistors. In the present invention, the upper frequency at which accurate logarithmic performance can be obtained is limited by the finite slew rate at nodes 248A and 250A (or 248 and 250) as the detector currents $I_d$ are reduced to reduce power consumption. FIG. 4B illustrates this slew rate limitation in the circuit of FIG. 4A. (Although this slew rate limitation will be explained with reference to the circuit of FIG. 4A, the explanation applies with equal force to the circuit of FIG. 4.) Capacitances 280B and 282B represent the total output node capacitance due to parasitic effects and input capacitances of succeeding circuits at nodes 248B and 250B, respectively. When the base of one of the emitter follower transistors 234B or 240B is abruptly switched negative, the voltage at its emitter decreases at a rate determined by the node capacitance and the detector current $I_d$. For example, as shown in FIG. 4B, a positive-going input signal 284B is applied to node 258B. In the same manner, a negative-going signal 286B is applied to node 260B. The voltage at node 248B increases almost immediately, as shown by waveform 290B, charging node capacitance 280B. By contrast, node 250B has to decrease in voltage and is limited by the rate at which node capacitance 282B can be discharged. This delay is shown by waveform 288B. Consequently, during the time interval when the voltage at node 250B is decreasing, transistor 238B remains essentially nonconducting and cannot contribute to the net detector and stage output at node 252B. The overall result of this phenomenon is a decrease in the effective gain as the frequency of the input signal increases, which in turn limits the useful bandwidth of the gain stage. Although primarily due to the low power consumed by the gain stage, the situation is exacerbated in the case where the logarithmic amplifier gain stage is powered by a single polarity power supply, since there is no negative supply voltage that could be used to rapidly discharge node capacitance 280B.

Figure 4C:
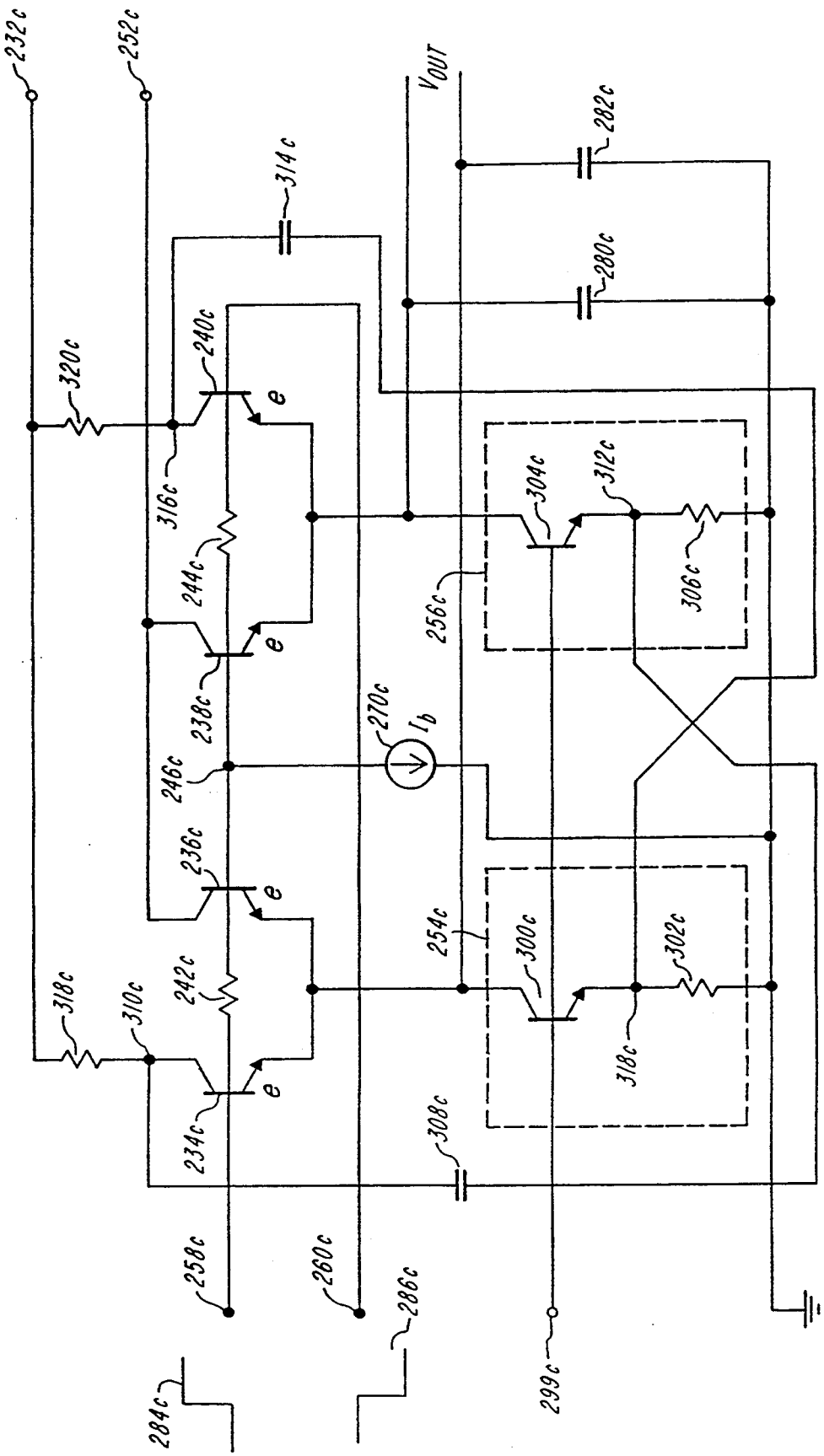
FIG. 4C illustrates a modification to the full-wave detectors of FIGS. 4 and 4A which overcome slew rate limitations without consuming additional power.

Reference is now made to FIG. 4C, which illustrates a full-wave detector circuit that overcomes the slew rate limitation of the circuit in FIG. 4B. In the detector circuit of FIG. 4C, transistor 300C and resistor 302C embody current source 254C while transistor 304C and resistor 306C embody current source 256C. An appropriate temperature-stable bias voltage is applied to terminal 299C. A capacitor 308C is connected between node 310C and 312C. A second capacitor 314C is connected between nodes 316C and 318C.

When signal 284C is applied to the base of transistor 234C (node 258C), a pulse of charge $Q_c$ equal to $(\Delta V_{310C}) \cdot (C_{282C})$ appears at the collector of transistor 234C. The impedance of capacitor 308C to the fast rising edge of signal 286C is much lower than the impedance of load resistor 318C, so almost all of the charge $Q_c$ is transmitted to node 312C. Node 312C also presents a low impedance to this current pulse. The voltage at node 312C decreases, causing transistor 304C to conduct an amount of current for a sufficient time to convey charge $Q_c$. Thus, node capacitance 280C is charged without delay by current from transistor 304C. The current provided to node 312C is exactly the current required to move node 250C by the change in voltage caused by signal 286C, while still leaving the appropriate fraction of bias current for the detector cell.

This topology allows the node capacitance of the negative-going output terminal to be charged by a current from the positive-going portion of the detector without requiring any additional power from the power supply.

Figure 5:
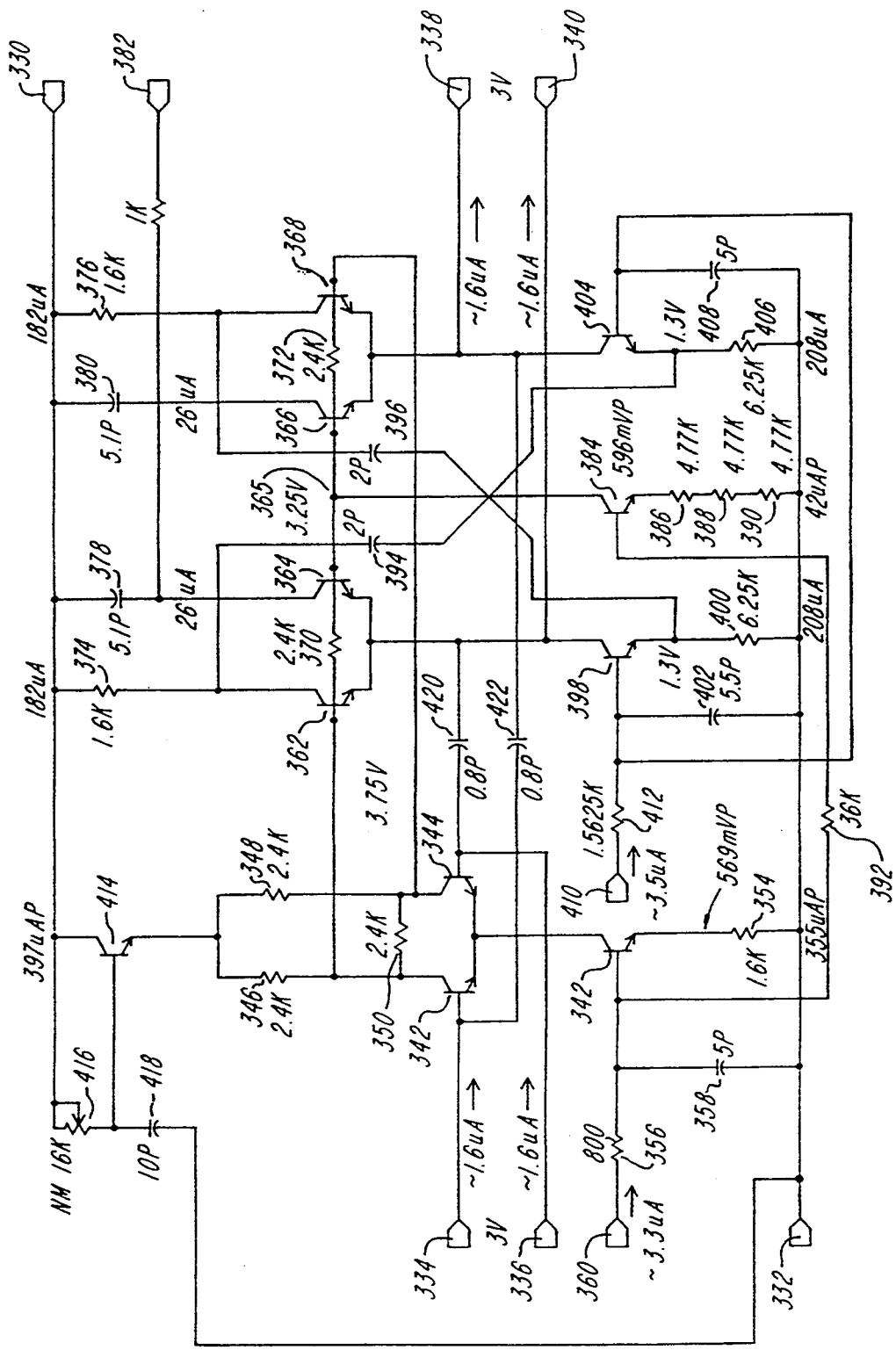
FIG. 5 is a detailed schematic circuit diagram for an embodiment of the gain stage of the present invention.

Reference is now made to FIG. 5, which is a detailed schematic circuit diagram of one embodiment of the logarithmic amplifier gain stage 200-i of the present invention. The circuit of FIG. 5 is a very low power gain stage powered by a single polarity power supply and typically consuming less than one tenth the power of one of the gain stages in the '803 patent. Stage 200-i includes limiting amplifier 216-i and full-wave detector 214-i. The stage operates from a single 5-volt supply, with +5 volts supplied to terminal 330 and a ground connected to terminal 332. The logarithmic input signal is applied between terminals 334 and 336 and the logarithmic output signal is available at terminals 338 and 340. A demodulated output signal is available at terminal 382.

Transistors 342 and 344, along with resistors 346, 348, and 350 form the differential limiting amplifier stage 216-i. Transistor 352, resistors 354 and 356, and capacitor 358 form the PTAT current source for the transistor amplifier. A PTAT beta-compensated bias voltage, generated in the manner described in the '803 and '909 patents, is supplied at terminal 360.

Transistors 362, 364, 366, and 368, along with resistors 370, 372, 374, 376 and capacitors 378 and 380 comprise the full-wave detector stage. Resistors 346, 348, 350, 370, and 372 are all unit value resistors as described earlier. Terminal 382 may also be used to receive a current for adjusting the intercept of the logarithmic amplifier gain stage. In the embodiment illustrated in FIG. 5, transistors 362, 364, 366, and 368 all have equal emitter areas. Transistor 384 along with resistors 386, 388, 390, and 392 is used to synthesize an area ratio between transistors 362, 364 and 366, 368 at node 365 in the manner described in connection with FIG. 4A. Transistor 368 receives the necessary PTAT bias voltage from terminal 360 via resistor 392.

Slew rate enhancing capacitors 394 and 396 are connected and operate in the manner described in connection with FIG. 4C to enhance the high frequency response of the gain stage.

Transistors 398 and 404, resistors 400 and 406, and capacitors 402 and 408 comprise the temperature-stable current sources for the full-wave detector. A temperature-stable bias voltage, generated in the manner described in the '803 and '909 patents, is applied to terminal 410 and biases the bases of transistors 398 and 404 via resistor 412.

Diode-connected transistor 414, pinch resistor 416, and capacitor 418 are used to lower the DC level at output terminals 338 and 340, further increasing the bias "headroom" for the detector-transistors and providing power supply-line decoupling at high frequencies.

When the logarithmic amplifier gain stage is used in a complete logarithmic amplifier system having multiple cascaded stages, it is necessary to control the variation of phase with changes in the input signal level to maintain accurate performance. As is well-known, phase errors arise because of the natural build up of phase lag that occurs in any multi-pole system. However, the phase lag is much more difficult to predict in a non-linear system such as a logarithmic amplifier. Feedback capacitors 420 and 422 minimize the variation of phase with variations in input signal level.

Having thus described one particular embodiment of the invention, various alterations, modifications, and improvements will readily occur to those skilled in the art. Such alterations, modifications, and improvements as are made obvious by this disclosure are intended to be part of this disclosure thought not expressly stated herein, and are intended to be within the spirit and scope of the invention. Accordingly, the foregoing description is by way of example only is not intended as limiting. The invention is limited only as defined in the following claims and equivalents thereto.

What is claimed is:

1. A logarithmic amplifier gain stage for supplying, in response to an instantaneous input signal, an output signal representing a portion of a corresponding logarithmic value of the input signal, comprising:

a transistor amplifier having an input that receives the input signal and an intermediate output that supplies an intermediate output signal; and a full-wave detector having an input coupled to the intermediate output of the transistor amplifier that receives the intermediate output signal and an output that supplies the output signal, the detector including a rectifier comprising rectifying transistors having different effective emitter areas for demodulating a signal applied to the input of the full-wave detector, wherein each rectifying transistor has a base and all bases of the rectifying transistors are coupled together by a single bias line.

2. The logarithmic amplifier gain stage of claim 1, wherein the full-wave detector further comprises means for increasing a slew rate of the gain stage without consuming additional power.

3. The logarithmic amplifier gain stage of claim 2, wherein the full-wave detector comprises two half-wave rectifiers that respectively respond to different polarities of the input signal.

4. The logarithmic amplifier gain stage of claim 3, wherein the means for increasing the slew rate comprises at least one capacitor coupling a first one of the two half-wave rectifiers to a second one of the two half-wave rectifiers.

5. The logarithmic amplifier gain stage of claim 1, further comprising means, coupled between the transistor amplifier and the full-wave detector, for reducing a variation in a phase of the output signal with a variation in a level of the input signal.

6. The logarithmic amplifier gain stage of claim 5, wherein the means for reducing a variation in a phase of the output signal with a variation in a level of the input signal comprises at least one capacitor coupling the transistor amplifier to the full-wave detector.

7. The logarithmic amplifier gain stage of claim 1, wherein the gain stage requires power from only a single polarity power supply.

8. The logarithmic amplifier gain stage of claim 1, wherein the different emitter areas are formed by physical differences in emitter areas of the rectifier transistors.

9. The logarithmic amplifier gain stage of claim 1, wherein the full-wave detector further comprises means for controlling a voltage between a base and an emitter of at least one transistor in the rectifier to synthesize the different emitter areas.

10. The logarithmic amplifier gain stage of claim 1, wherein the single bias line includes a plurality of resistors, each resistor having a resistance equal to or a multiple of a unit value.

11. The logarithmic amplifier gain stage of claim 4, wherein the means for increasing the slew rate comprises a first capacitor coupling an output of the first one of the two half-wave rectifiers to the second one of the two half-wave rectifiers and a second capacitor coupling an output of the second one of the two half-wave rectifiers to the first one of the two half-wave rectifiers.

12. A logarithmic amplifier gain stage for supplying, in response to an instantaneous input signal, an output signal representing a portion of a corresponding logarithmic value of the input signal, comprising:
   a transistor amplifier having an input that receives the input signal and an intermediate output that supplies an intermediate output signal; and
   a full-wave detector having an input coupled to the intermediate output of the transistor amplifier that receives the intermediate output signal and an output that supplies the output signal, the detector including at least two half-wave rectifies, each half-wave rectifier comprising a pair of transistors having different effective emitter areas and a resistor coupling a base of each transistor in the pair together and wherein a base of one of the transistors in one of the at least two half-wave rectifiers is coupled to a base of one of the transistors in another of the at least two half-wave rectifiers.

13. The logarithmic amplifier gain stage of claim 12, wherein the full-wave detector further comprises means for increasing a slew rate of the gain stage without consuming additional power.

14. The logarithmic amplifier gain stage of claim 13, wherein the one of the at least two half-wave rectifiers responds to a first polarity of the input signal and another of the at least two half-wave rectifiers responds to a second polarity of the input signal.

15. The logarithmic amplifier gain stage of claim 14, wherein the means for increasing the slew rate comprises at least one capacitor coupling a first one of the two half-wave rectifiers to a second one of the at least two half-wave rectifiers.

16. The logarithmic amplifier gain stage of claim 12, further comprising means, coupled between the transistor amplifier and the full-wave detector, for reducing a variation in a phase of the output signal with a variation in a level of the output signal.

17. The logarithmic amplifier gain stage of claim 16, wherein the means for reducing a variation in a phase of the output signal with a variation in a level in the input signal comprises at least one capacitor coupling the transistor amplifier to the full-wave detector.

18. The logarithmic amplifier gain stage of claim 12, wherein the gain stage requires power from only a single polarity power supply.

19. The logarithmic amplifier gain stage of claim 12, wherein the different emitter areas are formed by physical differences in emitter areas of the rectifier transistors.

20. The logarithmic amplifier gain stage of claim 12, wherein the full-wave detector further comprises means for controlling a voltage between a base and an emitter of at least one transistor in the rectifier to synthesize the different emitter areas.

21. The logarithmic amplifier gain stage of claim 12, wherein the resistor coupling a base of each transistor together has a resistance equal to or a multiple of a unit value.

22. The logarithmic amplifier gain stage of claim 15, wherein the means for increasing the slew rate comprises a first capacitor coupling an output of the first one of the two half-wave rectifiers to the second one of the two half-wave rectifiers and a second capacitor coupling an output of the second one of the two half-wave rectifiers to the first one of the two half-wave rectifiers.

* * * * *